United States Patent [19]

Dunn

[11] Patent Number: 4,563,638
[45] Date of Patent: Jan. 7, 1986

[54] TIME SELECTIVE FREQUENCY DETECTION BY TIME SELECTIVE CHANNEL TO CHANNEL ENERGY COMPARISON

[75] Inventor: Robert H. Dunn, Thousand Oaks, Calif.

[73] Assignee: Eaton Corporation, Cleveland, Ohio

[21] Appl. No.: 508,320

[22] Filed: Jun. 27, 1983

[51] Int. Cl.$^4$ ............................................. G01R 23/16
[52] U.S. Cl. .................. 324/77 R; 324/78 E; 324/78 F; 455/182
[58] Field of Search ................ 324/77 E, 77 G, 78 E, 324/78 F, 77 R, 76 R; 455/182, 165; 375/23, 102; 179/2 EB

[56] References Cited

U.S. PATENT DOCUMENTS

| | | | |
|---|---|---|---|
| 3,953,802 | 4/1976 | Morris | 375/10 Z |
| 4,137,497 | 1/1979 | Lowenschuss | 324/78 F |
| 4,166,927 | 9/1979 | Hamaoki | 179/2 EB |
| 4,215,315 | 7/1980 | Lambert | 324/78 E |
| 4,266,201 | 5/1981 | Belfatto | 375/23 |
| 4,280,140 | 7/1981 | Skerlos | 455/182 |
| 4,280,387 | 7/1981 | Moog | 324/78 F |
| 4,377,961 | 3/1983 | Bode | 324/78 F |

*Primary Examiner*—Michael J. Tokar
*Attorney, Agent, or Firm*—C. H. Grace; V. J. Ranucci

[57] ABSTRACT

A wide band receiver has connected to its input a series of narrow band channels. The incoming signal is processed through these narrow band channels with the greatest energy being produced in the narrow band channel closest to the incoming signal frequency. During the steady state portion of the signal the energy differences between the narrow band channel coinciding with the incoming signal frequency and channels higher and lower in frequency are maximum and exceed an established channel to channel ratio (CCR) level. A signal is produced by measuring the associated narrow band channel energy differences and comparing them to the channel CCR's. As the CCR comparison only produces a logic signal during the steady state portion of the incoming signal pulse, a clear unambiguous indication is provided of the relative energies between the narrow band channels. Additionally, a series of ESS curves are produced which have an amplitude responsive to frequency and responsive to the narrow band channel to narrow band channel energy comparisons. These comparisons are accomplished by taking the energy difference between adjacent narrow band channels and then the absolute magnitudes of these ESS curves are compared to produce logic signals indicative of frequency. The logic signals produced for the ESS curves are combined with the logic signals produced using the CCR's and during the steady state portion of the incoming pulse to produce a refined logic indication of the narrow band signal frequency.

13 Claims, 18 Drawing Figures

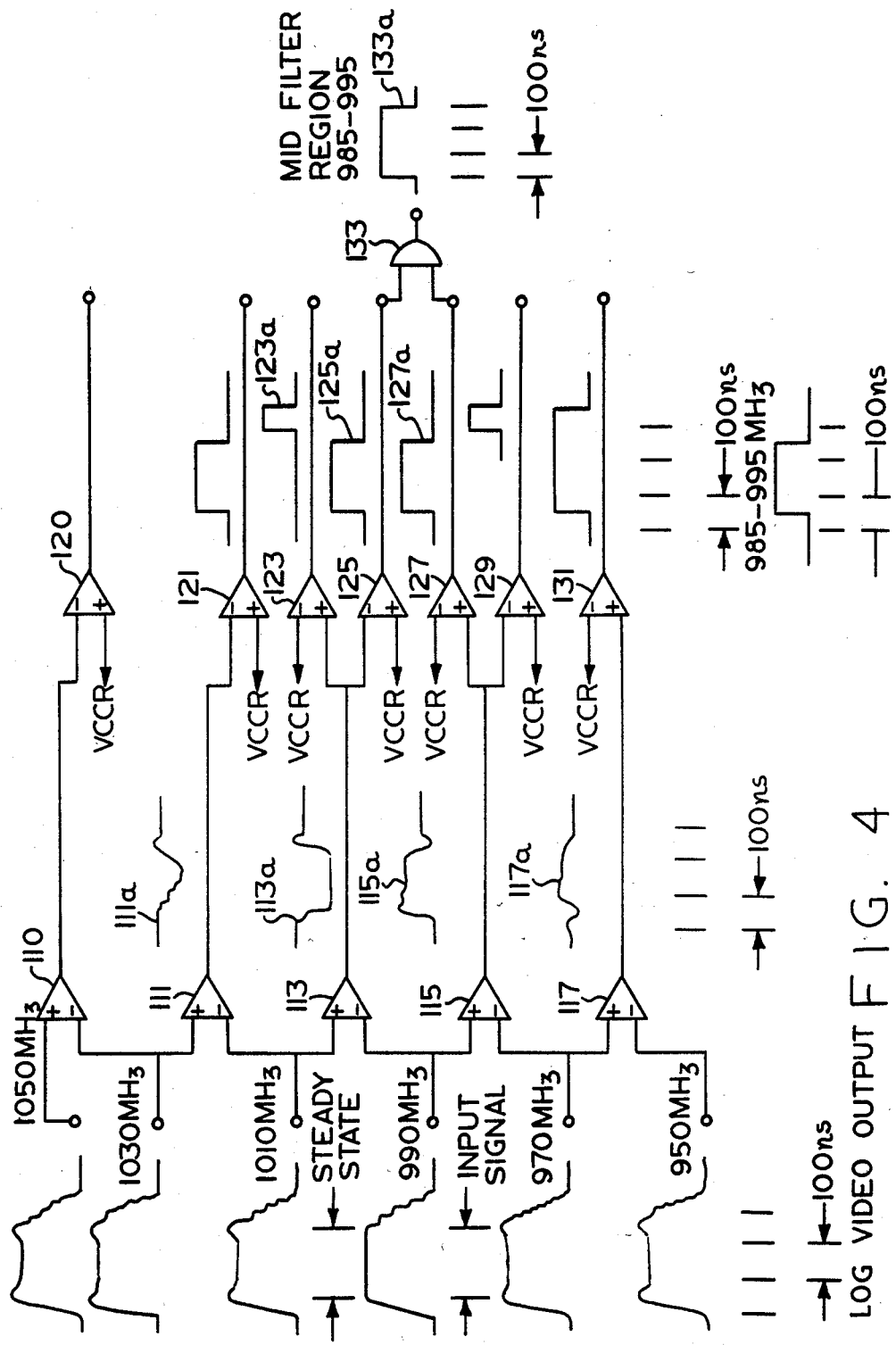

INTERCEPT CHANNELIZER BLOCK DIAGRAM 4,563,638

TIME SELECTIVE FREQUENCY DETECTION BY TIME SELECTIVE CHANNEL TO CHANNEL ENERGY COMPARISON

FIELD OF THE INVENTION

This invention relates to a wide band receiver and the detection of a signal from among a plurality of signals in a densely packed wideband frequency spectrum. It particularly relates to a detection and switching system whereby a radio signal is detected and then used to develop a series of logic signals to indicate the incoming signal frequency.

BACKGROUND OF THE INVENTION

Wideband receivers are associated with a large dynamic range. Associated with this dynamic range is frequency splatter. The incoming signal is selected from the wideband range typically by means of a filter. However, an incoming signal will cause frequency splatter extending over the wideband and beyond it and causing energy to be injected into each of the narrow band frequency selective filters. In wideband channelized receivers having continguous channelized filters, a splatter guard function providing an unambiguous indication of an inband signal frequency represents a major element of cost. Prior techniques for analyzing an inband signal involved wide and narrow filters and represented an investment of three filters per channel. An example is shown in U.S. Pat. No. 3,953,802 which uses the combination of wide and narrow band filters for determining when a desired signal is in the narrow band channel.

SUMMARY OF THE INVENTION

According to the principles of this invention a narrow band frequency is identified within a wideband dynamic range by an efficient resolution of the incoming signal frequency. According to the present invention, instantaneous frequency analysis of signals in a wide dynamic range may be accomplished by injecting the wideband signal input into a bank of narrow band filters (channels) and then providing selected activity information with regard to each channel output. The invention operates by recognizing that energy splatter over all channels is significantly present during the rise and fall time of the pulse, but not significantly present during its steady state time. The splatter level does not vary significantly with pulse carrier frequency and the transition energy over all channels is substantially evenly distributed, falling off slowly from a channel as the carrier frequency is moved away from the channel. Due to this splatter, introduction of a pulse signal into a wideband receiver, causes the channels and their filters connected therein, to become active whether or not the pulse carrier frequency is within the channel pass band. Consequently, filter assignment tasks and frequency discrimination are difficult if not impossible. According to the principles of the invention, the input signal spectrum representing the wideband spectrum, is routed through a bank of channelized narrow band filters. The bank contains narrow band filters which may be contiguous and with each channel defined by a narrow band filter having a pass band representing a part of the wideband input. The invention operates by comparing signal levels during the pulse steady state time as frequency selectivity is minimum during the pulse carrier rise and fall times when splatter is substantial. Therefore, the channelizer is designed to respond to the steady state portion of the pulse carrier when splatter is less and the energy level differences between adjacent channels is greater. Accordingly, the channelizer will force a correct channel assignment or frequency identification in the presence of large amounts of splatter or of simultaneous signals when separated by at least one defined channel.

According to the inventive principles, the preferred embodiment comprises a bank or set of narrow band filters defining channels which are connected to receive a wideband frequency input. The output of the channels are provided to a log amplifier bank which provides amplitude levels related to the energy levels in each channel. In accordance with the principles of the invention, energy levels within adjacent channels significantly differ during the steady state period of the pulse. The outputs of each of the channels are compared to each other and to channel to channel reference levels to produce an output indication. The indication is produced by a means which is nonresponsive to energy in the narrow band filters in the period of greatest splatter during rise and fall times of the pulse carrier, but which is responsive during the steady state portion of each pulse, when a reliable output indication can be produced. During the steady state pulse time, an indication of the energy level in each narrow band filter is provided by means of separate channel-related log video amplitude outputs and then by comparing the log video amplitudes for related or adjacent channels. Comparison of the log video voltages removes the effects of splatter by providing a residue signal which is an analog of the difference in power levels between channels. The residue signal is then compared to a threshold level or channel to channel ratio level (CCR) which produces an indication of channel pairs having a signal difference or energy level difference exceeding the CCR. These CCR's are chosen to be greater than the channel to channel energy level differences during the edge transition time or rise and fall time, with the result the channelizer does not produce an output and is forced to be nonresponsive during the edge transition times. In between edge transition time, after the rise time and before the fall time of the pulse carrier, during steady state, frequency detection may be accomplished.

According to the principles of the invention the CCR's may be chosen as close as possible to the channel to channel energy level differences during the period of greatest splatter, but sufficiently greater than those energy levels to produce an unambiguous response in the system during the steady state time. As would be known by one skilled in the art where the comparators are made more sensitive, the CCR level threshold may be brought closer to the energy level differences actually experienced during the periods of greater splatter. Additionally, it should be recognized that where the term exceeded is used, it means the crossing of one amplitude over another, such as the energy level amplitude over the CCR level and may be in either of the two possible directions without departing from the principles of the invention (i.e. the energy level may exceed the CCR by going higher in a positive direction or in a negative direction.

In the preferred embodiment, a center channel or center channels are arranged with adjacent guard channels on each side. The amplified output of the center channel is compared with the center channel's respective guard channel outputs. In the preferred embodiment, these comparisons are energy difference comparisons.

The channel difference energy levels then are compared to the CCR levels. The output of the CCR comparators are logic signals and are provided to first and second logic trees which produce a first logic signal to responsively define the frequency. The logic trees provide a first frequency indication signal of whether an input signal is within a crossover range between adjacent channels or within a channel filter midband frequency range.

Additionally, the crossover and midfilter logic indications may also be provided to a third logic tree which has as a second input, energy level indicative signals related to frequency and to energy level differences between channels and produces a second logic signal responsive to the input signal frequency. While the first logic signal is sufficient to define the input frequency, it may be combined with the second logic frequency indicative signal produced by the aforesaid channel to channel energy comparisons and third logic tree to produce a third frequency indicative logic signal.

Further, and according to the principles of the invention, the trailing edge of the incoming pulse may be used to inhibit processing during the pulse fall time. When the scalloping on a pulse's edge is deepest, logic tree discriminator CCR gates and channel assignment comparators may attempt a false assignment. The trailing edge blanking signal is therefore developed to guard against false CCR generation.

The channelizer logic shown herein may be used to provide channel activity indications for purposes of spectrum analysis by frequency cell or channel. The logic shown herein produces a filter band signal indication within the dynamic ranges derived from the energy or envelope detector performance.

As a first object of the invention, it time selectively produces a frequency indicative first logic indication response during that period of the pulse when it is at steady state and produces a splatter-free signal. This is accomplished for the case when the signal is within the center or midfilter range of a channel through a first logic tree and when in the crossover range of a channel through a second logic tree and for other cases as described.

Further, and as a second object of the invention, a second logic indication may be produced by comparing the frequency dependent energy levels of the center and guard channels to each other through a third or discriminator logic tree to produce a second set of frequency dependent logic signals. These second set signals may be used alone as in the case of the first set of midchannel or crossover CCR logic signals to produce a frequency indicative output or may be used by itself combined with the first set logic signals to produce a time-dependent frequency indicative output.

DESCRIPTION OF THE DRAWINGS

FIG. 4 shows a first logic tree for determining whether an incoming signal is in a channel's midfilter range during the steady state pulse period.

Referring now to FIG. 1, the splatter problem may be referenced to single input pulse 101 shown as a 990 MHz signal having a pulse width of 100 nanoseconds. The signal is provided on line 103 into wide band receiver 105. The output of receiver 103 is supplied to a number of filter channels 107A through 107G each of which have a defined pass band or channel width within the wide band frequency spectrum. As would be known to those skilled in the art, the outputs of the channels are least distorted at the channel having a center frequency closest to the input signal frequency. As the object of the invention is to identify the incoming frequency within the broad band input, the invention accomplishes this object by identifying the energy content of the channels excited by the input signal. The narrow band filter having a frequency most closely matched to the incoming signal frequency would have the greatest energy. However, as explained, during pulse time and fall, the splatter causes simultaneously broad band uniform energy distribution over all of the separate channels so identification is difficult if not impossible. This invention may accomplish its object by time-related identification of energy levels within the narrow band filters.

In FIGS. 3a-3e, a number of possible cases are shown for the energy distributions within the channels 107A-G and the logical manner those energy levels may be analyzed to provide a clear unambiguous indication of the incoming signal frequency.

Referring now to FIG. 2, the frequency response of a narrow pass filter within a channel such as 107A may be shown where the center frequency is shown as fo, the lower crossover point being f×l and the high crossover point being f×h. The crossover points are arbitrary designations and in this case are shown as the −3 dB points in filter response characteristic relative to the center frequency. Additionally, but not necessary to the principles of the invention, the filter may be characterized by its response at frequencies midway between the center frequency fo and the crossover points f×l and f×h shown here for example as the −1 dB point at the lower-upper quarter boundaries. As would be known by those skilled in the art, the more selective the filter, the faster the response falls off while the less selective the filter, the slower the response falls off relative to frequency. Typically filters are designed for the response to fall off rapidly as shown by the dash lines, after frequency exceeds the crossover points in either direction.

Referring to FIGS. 3a–3f, the various cases are shown for the energy distibution over the narrow band filter channels, 107A to 107G of FIG. 1. FIGS. 3a–3f show the energy distributions within each of the narrow band filter channels A to G, with respect to a carrier appearing in one or more of the channels as shown. In FIG. 3a, the carrier fo is shown within a range of frequencies centered about the midpoint of channel D. As would be expected, the energy levels fall off in the adjacent channels on either side of D. It should be understood that for the case of FIG. 3a and for cases 3b–3f, the amount of energy distribution in the adjacent filters would depend upon the carrier frequency and its location relative to the center frequency of the filter and the crossover points as shown with regard to FIG. 2. For the purpose of explaining the invention, the energy distributions for FIGS. 3a, 3b, 3d, 3e and 3f are shown for the steady state pulse period. The case for the time of greatest splatter, during the rise and fall time of the pulse is as shown in FIG. 3c. As can be seen, one of the advantages of this invention is its ability to instantaneously compare energy distributions and thus determine pulse steady state when a splatter-free indication may be obtained.

In FIG. 3b, the carrier fo is shown between filters C and D and located in the crossover range. It should be understood as in the midfilter case of FIG. 3a, that the crossover case is a range of frequencies centered about the crossover point as defined for the adjacent filters, channels C and D. The energy distribution may be that as shown on FIG. 3b where the carrier is in the crossover region. The energy levels would shift toward the right or higher frequencies as the carrier fo shifts toward the right away from the crossover region and the energy levels would shift toward the left as the carrier fo shifts in frequency toward the left or toward a lower frequency.

In FIG. 3c, splatter or simultaneously broad band essentially uniform in energy distribution is shown where the energy level differences between each of the filters are small and more difficult to discern.

In FIG. 3d, the energy distributions are shown for two carrier frequencies $f_1$, $f_2$, each located approximately at the midpoint of two nonadjacent channels.

In FIG. 3e, the energy distributions are shown for the case of two simultaneous signals, $f_1$, $f_2$, in nonadjacent channels with one signal in a crossover region and one signal being at a midchannel region.

FIG. 3f shows the energy distribution for the case of simultaneous signals, $f_1$, $f_2$, at the respective crossover points of adjacent channels.

Signal separation can be achieved by using filters to achieve input spectrum frequency sampling over a designated bandwidth resolution. In the case of the preferred embodiment, the band width is a −3 dB band width resolution with regard to filter center frequency. According to the principles of the invention, the channelizer logic detects channel energy distribution over this 3 dB bandwidth resolution to determine the incoming signal channel frequency.

Figure 3A:
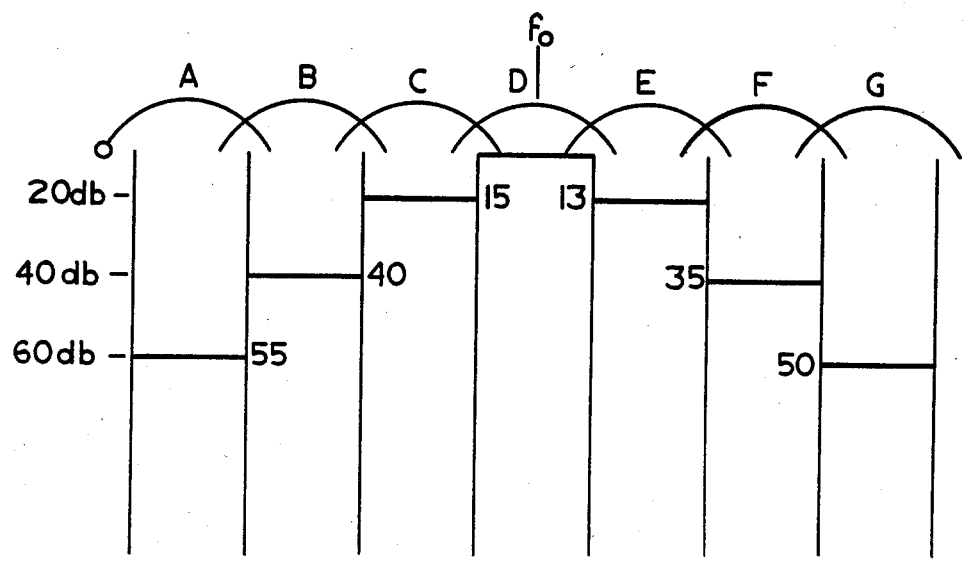
FIGS. 3a-f show the resultant energy levels within a band of filters, in response to an incoming signal.

In the case of energy distribution in FIG. 3a, where the incoming carrier is at or approximately near the center frequency or midchannel region of the narrow band channel, then as shown, the energy distribution will be:

$$D>C+D>E \therefore D=\text{Real}$$

For case 3b, where the signal is in the channel crossover region, then the energy levels would be:

$$C\approx D+C>B+D>E \therefore C \text{ or } D=\text{Real (not both)}$$

In case 3c, where splatter produces essentially uniform energy distribution, then the energy distributions would be:

$$A<B\approx C\approx D\approx E>G \therefore \text{none}=\text{Real}$$

Figure 3B:
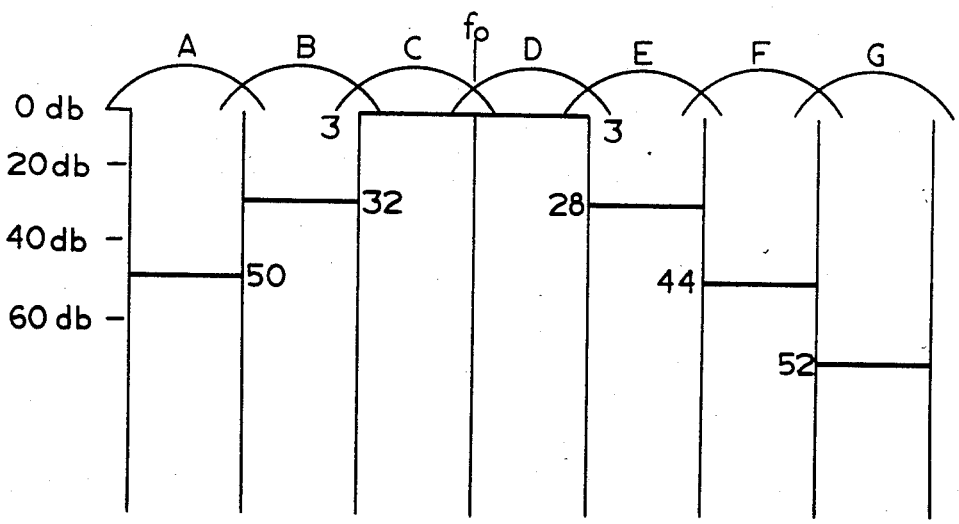
Figure 3C:
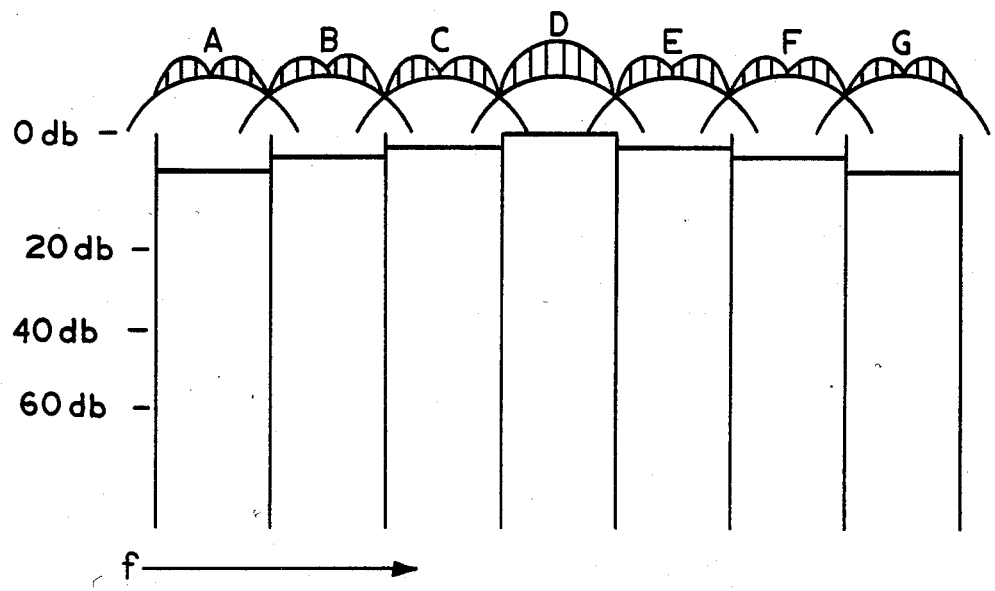
Figure 3D:
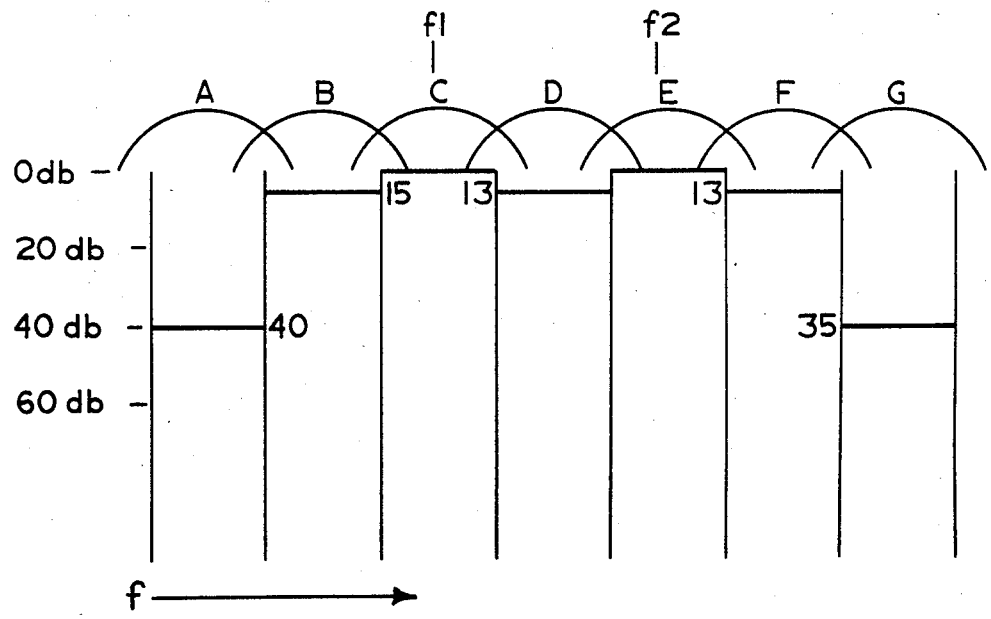

In the case of FIG. 3d, where simultaneous signals appears on nonadjacent channels, then the energy levels would be:

$$C>B+C>D \therefore C=\text{Real}$$

$$E>D+E>F \therefore E=\text{Real}$$

Figure 3E:
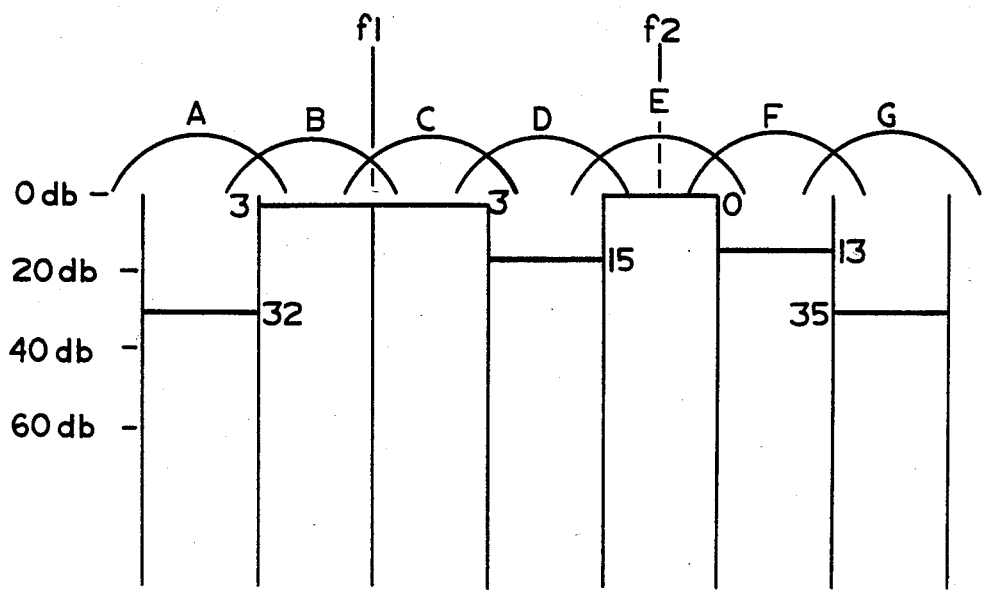

In the case of FIG. 3e, where simultaneous signals occur in nonadjacent channels and with one signal being in a crossover region, then the energy levels are:

$$B\approx C+B>A+C>D \therefore B \text{ or } C=\text{Real}$$

$$E>D+E>F \therefore E=\text{Real}$$

Finally, in the case of 3f where simultaneous signals occur in adjacent channels at the crossover regions, then the energy distribution is:

$$C\approx D+C>B+D\not> E \therefore C \text{ or } D\neq\text{Real}$$

$$E\approx F+E\not> D+F>G \therefore E \text{ or } F\neq\text{Real}$$

The $C\approx D\approx E\approx F$ ambiguity is that either two signals are present with less than one filter separation or there is one signal in $D\approx E$ crossover or a splatter condition exists, thus the C, D, E and F channel responses are inhibited.

All of the six cases given can be logically decoded using the principles of this invention.

The invention is now shown with regard to FIGS. 4, 4a, 5, and 6.

The channelizer uses the output of the channel or channels, in the crossover case as in FIG. 3b, having the frequency response closest to the incoming signal and uses the output of the guard channels, which are shown, in the preferred embodiment, to be the adjacent channels located on either side of the center channel or channels. The outputs of the center channel or channels and the guard channels are combined through separate logic trees to determine the incoming narrow band frequency. This is accomplished according to the principles of the invention by using logic trees that are designed to time selectively respond to the steady state pulse time during which incoming frequency may be measured and which is designed to be nonresponsive to the pulse edge portion. A first logic tree relates the signal from the center channel or channels and the adjacent guard channels to a CCR level to produce a first logical signal responsive to the incoming frequency and which is time responsive to the continuous or steady state portion of the incoming pulse when the pulse is splatter-free. The significance of producing a pulse during the steady state pulse time, when the pulse is splatter-free can be seen with reference to FIGS. 3a, 3b and 3c. During this splatter-free portion, the energy differences in each adjacent channel are greater and are more easily measured. During the pulse time, splatter is greatest as in the case of rise and fall times, the energy distribution as in the case of FIG. 3c is less between the adjoining filter channels and more difficult to measure.

Figure 4A:
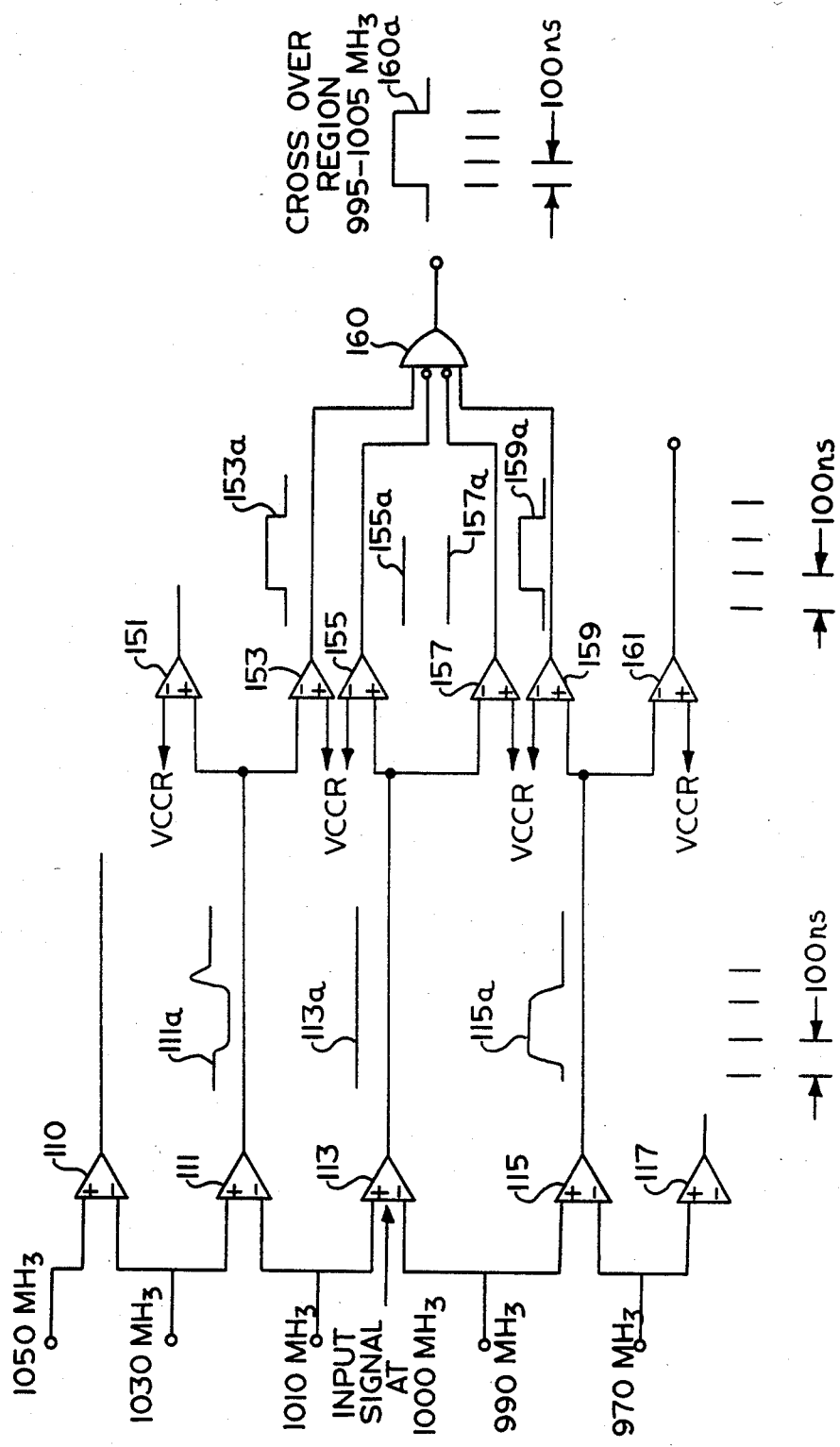
FIG. 4a shows a second logic tree for determining whether an incoming signal is in the crossover range between channels during the steady state pulse period.

Referring now to FIGS. 4 and 4a, the first object of the invention is illustrated by log video outputs of a bank of N narrow band filters illustrated with center frequencies from 950 MHz to 1030 MHz. The log video outputs shown are responsive to an input frequency with each channel having the center frequency and bandwidth of its respective filter output. The input signal in the example is shown at 990 MHz for FIG. 4 and at 1000 MHz in FIG. 4a, with the resultant log video outputs as shown for each channel.

Figure 1:
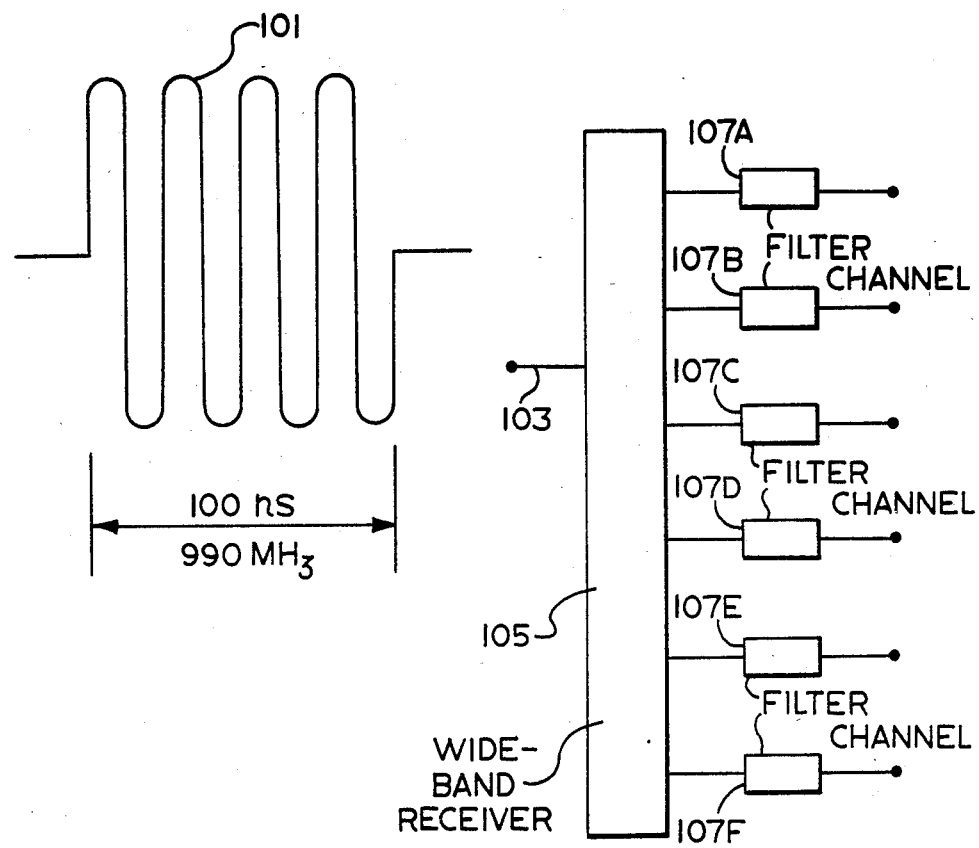
FIG. 1 shows a wideband input and a bank of narrow band filter channels for receiving a pulse input.
Figure 5:
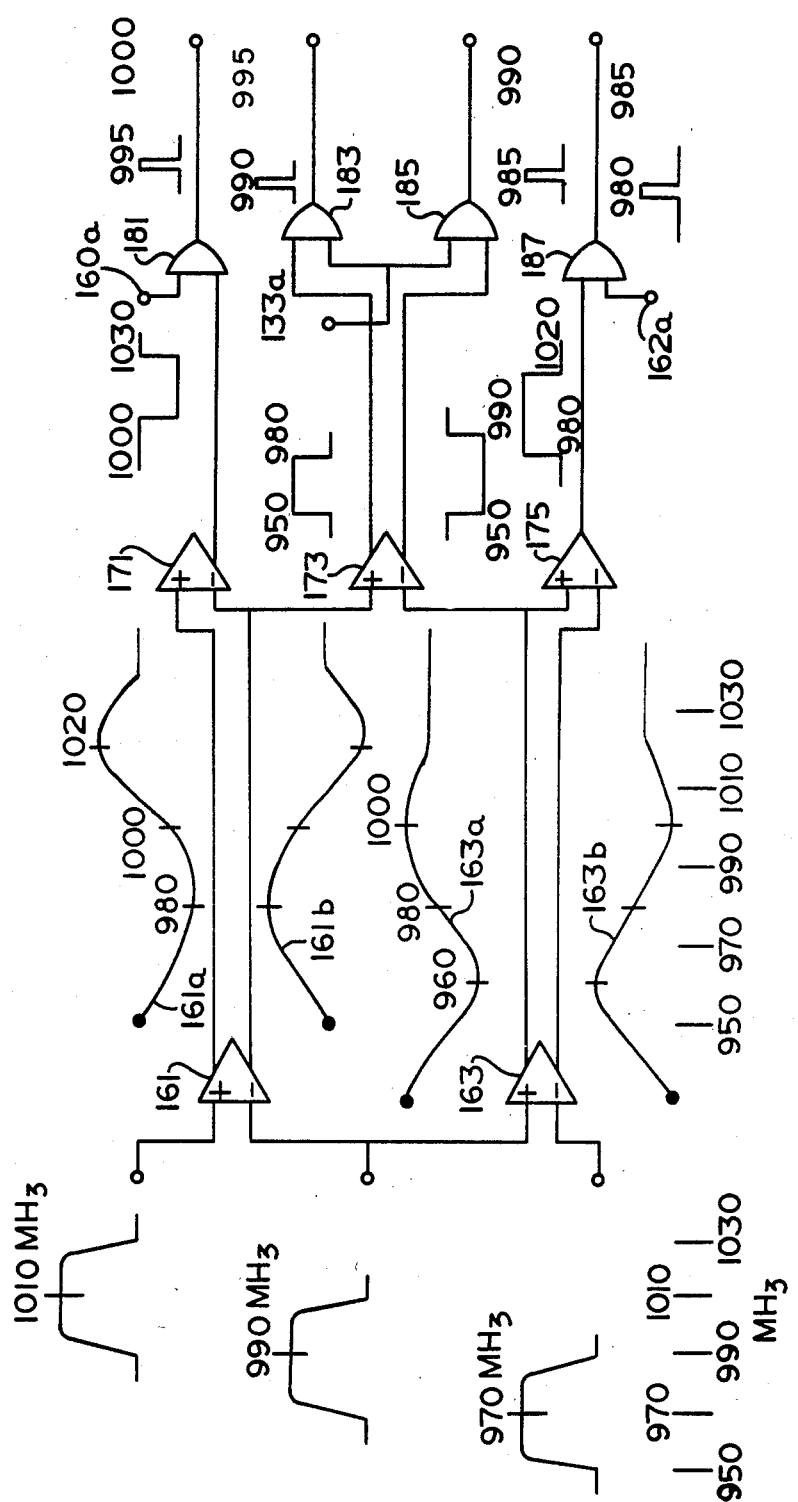
FIG. 5 shows a third logic tree used to determine the frequency of an incoming signal by directly comparing frequency responsive energy levels in adjacent channels.

The channel log video envelopes in FIGS. 4, 4a and 5 present energy levels at the outputs of each of the filters 107A-G, shown for example in FIG. 1. The log video output may be a voltage level responsive to energy and with the relative log video output levels of each channel being indicative of the incoming signal frequency and its distribution over the bank of narrow band filters, 107A-G, for example, (each filter's respective channel).

For each of the N channels, the channels adjacent to a respective one of the N channels represent guard channels and as may be seen, each of the N channels is a guard channel for adjacent ones of the N channels.

A first logic tree is illustrated in FIG. 4 with respect to a first center channel for determining if the incoming signal is in the center channel midfilter range and for producing a first logic signal indicative thereof. A second logic tree is illustrated in FIG. 4a with respect to center channels and adjacent channels for determining if an incoming signal is in the crossover region of the center channels for producing a first logic signal indicative thereof.

Figure 2:
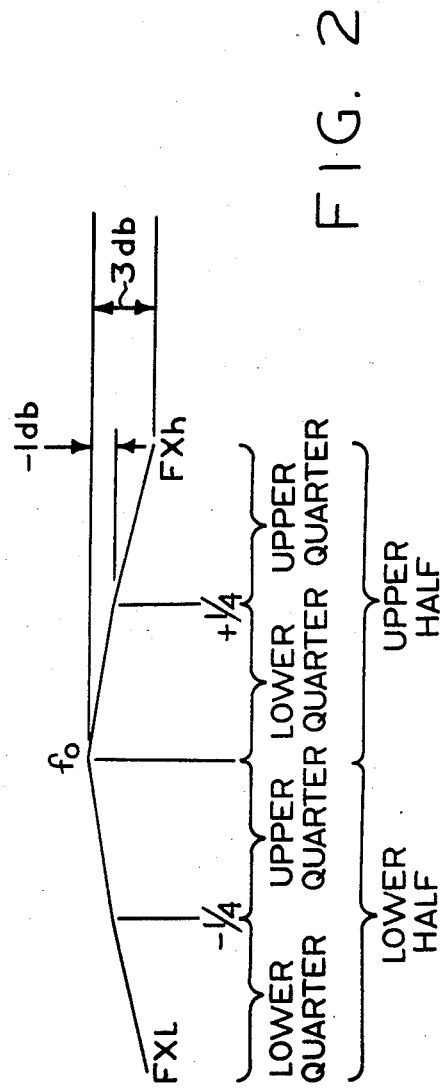
FIG. 2 shows a filter response with respect to frequency.

As part of the first logic tree for determining whether the input signal is in the midfilter range, four difference amplifiers are connected to the outputs of the center channel log video output and to the outputs of the adjacent guard channels. In the example of FIG. 4 shown, the filters are all of a 20 MHz bandwidth and the central frequencies of each filter being given as 950, 970, 990, 1010 and 1030 MHz as stated. The pulse width of the input signal is approximately of 200 to 300 nanoseconds duration. The first logic tree comprises video difference amplifiers 113 and 115 connected as shown, and comparators shown as 125, 127, each connected to the output of a respective video difference amplifier 113, 115 and connected to a CCR level input. The CCR level for this case and the following may be set at the level necessary and consistent with the filter responses and the crossover points to be responsive to the energies in the filters during the steady state pulse time and to be nonresponsive during the edge portions of the pulse. For the general case filter as shown in FIG. 2, the threshold levels may be made consistent with the frequency response of the filters. As the frequency response of the filter and its selectivity becomes less, the threshold levels would be changed accordingly.

The incoming signal produces log video outputs as shown. In the example shown, the incoming signal is approximately 990 MHz, the 990 MHz filter output is larger in comparison with the 1010 MHz and 970 MHz filter outputs, it being understood, the more removed a filter is from the incoming frequency, the less energy at its output, as shown in FIG. 3a. The difference amplifier outputs are shown as 111a, 113a, 115a, 117a and have the highest level as shown for 115a and 113a resulting from the comparison of the 990 MHz signal with the adjacent or guard channel signals.

As the pulse input width is 200 to 300 nanoseconds, the output of the difference amplifiers 113 to 115 are also 200 to 300 nanoseconds. The CCR comparators are then used to compare these difference outputs 113a and 115a, with an established CCR level to produce a first logic signal responsive to the steady state pulse period as shown in FIG. 4. This is accomplished by setting the CCR's at a level greater than the channel to channel level difference occurring when splatter is the greatest, as shown in FIG. 3c (during the edge portion of the pulse) and may be as small as may be consistent with the sensitivity of the CCR comparators. In FIG. 4, a first logic tree is shown, for producing a first logic signal indicative of the incoming signal being in the midfilter region, having a first comparator 125 connected through its negative input, to the output of the video difference amplifier 113 which compares the center channel at 990 MHz with the next adjacent higher frequency channel at 1010 MHz and produces a pulse of approximately 200 to 300 nanoseconds. That pulse 125a corresponds to the steady state pulse period when the output of its corresponding video difference amplifier 113 exceeds the CCR level. For the sake of explanation, it may be assumed that the CCR level is set at 6 dB. Comparator 123 does not produce a pulse during the steady state time of the incoming signal, but does produce a pulse 123a during the pulse fall time of the incoming signal when it peaks and is greater than 6 dB above the CCR. Comparator 127 is connected to the output of difference amplifier 115 which compares the output of the center frequency filter and the next lower adjacent guard filter. It produces a logic pulse 127a when the output of comparator 127 exceeds the respective CCR by 6 dB (during the steady state pulse time). A logic pulse is produced by comparator 129 at the fall time of the incoming signal, when the output of the comparator falls below the CCR. In FIG. 4 are also shown comparators 120, 121 and 131 connected by difference amplifiers 110, 111 and 117 respectively to filters having center frequencies of 1050 MHz, 1030 MHz, 1010 MHz, 970 MHz and 950 MHz to show a partial expansion of the logic network for other center channels as explained below. Pulses such as 123a and 127a occurring after the steady state pulse period may be used as an inhibit signal.

As can be seen for the first logic tree shown in FIG. 4 where the incoming signal is within the midchannel range of a narrow band filter, then the first logic tree will produce a logic pulse, as shown at the output of gate 133, indicative of pulses 125a and 127a which indicates the incoming signal frequency is in the first logic tree center channel midfilter region (990 MHz).

For the first logic tree of FIG. 4, used to detect when an incoming signal is in the midfilter range of a channel filter, the filter having the midfilter range matching the incoming signal frequency range such as 990 MHz, forms the center channel. The adjacent filters, such as 1010 and 970 MHz, on either side, having higher and lower center frequencies are guard channels whose outputs are compared with the center channel output and through the first logic tree to produce the indication when an incoming signal frequency is within the midchannel range. As can be seen, the network of FIG.

4 can be expanded by adding filters above 1050 MHz and below 950 MHz along with associated logic elements connected thereto to construct additional first logic trees for other respective center channels, which may serve a dual function as guard channels. The outputs of each designated center channel would then be combined with their respective guard channels (which may also serve as center channels) on either side thereof with respect to frequency to provide a clear unambiguous indication during the steady state pulse time when the incoming signal is in the midfilter region of that designated center channel. In summary, the first logic tree may be replicated for each channel to provide a midfilter first logic signal for its respective channel.

Figure 6:
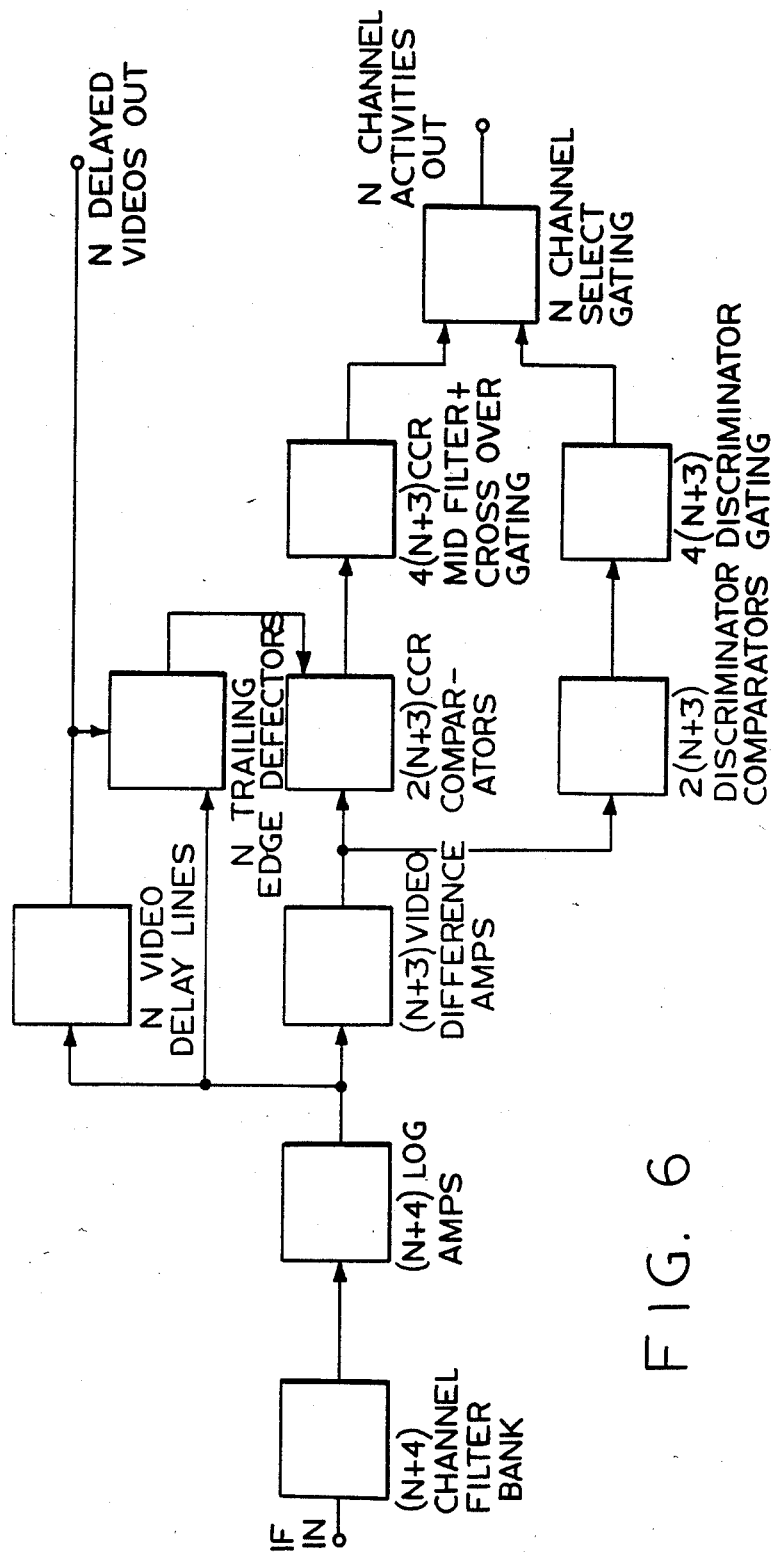
FIG. 6 shows in general form the number of elements for each first, second and third logic tree elements for a bank of N filter channels.

Part of the first logic tree of FIG. 4 such as the difference amplifiers, may also be used in a second logic tree to detect signals in the crossover regions of adjacent filters. The first and second logic trees are shown separately in FIG. 4 and FIG. 4a, respectively, for the purpose of explanation, it being recognized that common units may be combined as shown in FIG. 6. As can be seen, the first logic tree uses a center channel and guard channels to decode the incoming signal frequency. The object of this first logic tree as stated is to produce a logic signal responsive to an incoming frequency signal in the midfilter region and at a time when the signal is splatter-free during the steady state. Where the incoming signal is located at the crossover region, at 1000 MHz for example, and the energy levels within adjacent filter channels are as shown with regard to FIG. 3b, then the output of respective video difference amplifiers of FIG. 4 would be as shown in FIG. 4a. FIG. 4a shows the signal levels out of the difference amplifiers shown in FIG. 4 when the incoming signal is at a crossover region, 1000 MHz, for example.

As shown in FIG. 3b where the signal is in a crossover region, the energy in adjacent filters such as C and D in FIG. 3b is approximately equal. The output of the difference amplifiers, 111, 113 and 115 are as shown by the wave forms 111a, 113a and 115a. During the steady state period of the incoming pulse, when the energy distribution in the center channels is as shown in FIG. 3b, the outputs for the difference amplifiers are substantially zero for 113 (113a), low for 111 (111a) and high for 115 (115a). The CCR comparators, forming the second logic tree, are 153, 155, 157, and 159. It should be understood that while a separate set of comparators is shown for the case of the second logic tree for crossover, comparators common to FIGS. 4 and 4a may be used interchangeably, as would be known to those skilled in the art. When the incoming signal (1000 MHz, for example) is in the crossover region of two adjacent filter channels, such as the filter channel having a center frequency of 990 MHz and the filter channel having a center frequency of 1010 MHz, the energy levels therein are equal and their difference is zero as shown by the output 113a of difference amplifier 113. The outputs of the other difference amplifiers associated with the respective guard channels are 111a and 115a as shown for amplifier 111 and 115. When the output is substantially zero, as for 113 and where that output is less than the CCR level of the comparators shown for 155 and 157, then the comparator outputs 155a and 157a are low as shown. For difference amplifiers 111 and 115 connected between adjacent center channel filters and respective guard channels located on each side of the center frequency, such as 1030 MHz and 990 MHz channels, the comparator will produce pulses 153a and 159a having a time duration corresponding to the steady state portion of the incoming signal. For a signal in the crossover region, the logic signals 153a, 155a, 157a and 159a of a second logic tree may be combined as shown in an AND gate 160 to produce a first logic signal 160a indicative of a signal in the crossover region. The term "first logic signal" is used interchangeably for a midfilter or crossover indication as the case may be. As in the case of FIG. 4, the respective crossover center channels of FIG. 4a (1010 and 990 MHz) are combined with guard channels (1030 and 970 MHz) or channels adjacent the respective crossover center channels in a second logic tree to process the output of the video difference amplifiers. The center channels, 1010 MHz and 990 MHz, in the case of crossover region, contain substantially the same energy. The energy in each adjacent or guard channel to either side of the center channels is less as the incoming signal frequency is further away from the center frequency of these channels. In the example shown in FIG. 4a, the logic signals shown are produced for an incoming signal of 1000 MHz located in the channel crossover range of 995 to 1005 MHz between the 990 MHz and 1010 MHz channels. However, it should be understood that as the selectivity of the filters decreases and the response of the filter over frequency increases, the channel boundary will shift in toward the center for the same CCR level. However, the crossover region of 995 to 1005 may be expanded to 992 to 1008 also by increasing the CCR level requiring a greater difference in channel response at frequencies closer to the center frequency of the filters. As in the case of the midfilter first logic tree of FIG. 4, the crossover second logic tree of FIG. 4a may be replicated for each crossover frequency region and respective channels.

Then as can be seen and according to the principles of the invention, the channelizer develops a signal indicative of the incoming signal frequency and related to a narrow band filter channel in a first case by comparing energies in a center channel in the midfilter case, or center channels in the crossover case, with adjacent or guard channels and by further processing signals representing that comparison through a first or second logic tree respectively to produce a first logic signal to define the incoming frequency during the steady state pulse time. In the case of signals appearing within the midfilter range of a channel, the outputs of that center channel, and the two adjacent or guard channels on either side of the center of that channel are processed to produce a first logic signal responsive to the signal frequency during the steady state portion of the pulse. In a similar manner when an incoming signal is located at the crossover region between two adjacent center channel filters, the guard channel filters are on either side of the center channel filters. The outputs of the center channels and the guard channels are then processed as shown in the second logic tree of FIG. 4a to produce a first logic signal indicative of signal frequency in the crossover region between adjacent filters, during the steady state portion of the incoming pulse and during the splatter-free time. The logic signal is produced by comparing channel to channel energies with predetermined threshold levels, shown as CCR's to produce an output responsive to the steady state incoming signal pulse period, and uncontaminated by the energies generated by the pulse edge portions.

As the object is to define the incoming signal frequency, the inventive principles are described with reference to such a result. However, it should be understood that using the inventive principles, the signals can be combined to make the result more definite. Additional logic can be added and/or filter sensitivity can be increased to make the logic signal more selective and related to a narrower band of incoming frequencies.

Further, according to the principles of the invention, and as shown in FIG. 5, a second frequency responsive logic signal may be developed by a third logic tree. These signals are developed from the frequency responsive energies in each channel and use direct channel to channel comparisons instead of comparison to channel to channel ratio levels (CCR).

In FIG. 5, outputs of the narrow band filter channels are provided as log video output to difference amplifiers 161 and 163 which compare the energy in a center filter channel with that of two adjacent or guard channels on either side of the center channel. The single channel discriminator of FIG. 5 may be used alone or with the CCR gate outputs of the first and second logic trees of FIGS. 4 and 4a to provide an alternate second frequency logic signal indication of incoming signal frequency and to produce a signal occurring and resulting from the continuous or steady state portion of the input pulse when the signal is substantially splatter-free. In this way, the pulse output of the CCR gating ensures that the frequency response pulse output of the third logic tree frequency discriminator in FIG. 5 is produced only during the steady state portion of the incoming pulse.

The single channel discriminator comprised by the third logic tree in FIG. 5 is responsive to energy levels within a center and adjacent or guard filters to determine the incoming signal frequency. The third logic tree of FIG. 5 discriminates by comparing the relative amplitudes of the above stated energy levels, and is able to produce a frequency output signal indicative of an responsive to those relative amplitudes. By itself it produces independent signals and may be further combined with the output of the CCR gates of the first and second logic trees to produce a logic signal determinative of the incoming signal frequency. Whereas the CCR gates produce a signal responsive to the pulse steady state, the discriminator of FIG. 5 produces amplitudes related to the response of the channel filters during the entire period of the input pulse. As it responds to the energy in the filters during the steady state as well as the rise and fall time, it produces an output signal over the pulse period. The discriminator as stated uses a center channel filter and two adjacent or guard channel filters. Unlike the CCR gate, no thresholds are used. The relative energy levels within the center channel on the adjacent guard channels are compared in difference amplifiers which produce first and second signal set intermediate signals shown as "ESS" curves (161a and its inverse 161b, 163a and its inverse 163b), and whose amplitudes vary above and below a median level, zero, for example, over the frequency range of its respective channel filter. These relative amplitudes represent intermediate signals whose amplitudes are related to frequency and which may be further processed by comparing the amplitudes to each other to produce a frequency responsive output. In the third logic tree shown in FIG. 5, the comparator 171 is shown comparing the frequency responsive amplitude output of the center channel and the adjacent upper frequency or guard channel, or first signal set amplitudes 161a and 161b. Comparator 173 is shown comparing the amplitudes of a signal within the first signal set (161b) with a signal in the second signal set (163b). The comparator 175 is shown producing a logic signal resulting from the comparison of the second signal set amplitudes 163a and 163b. It should be understood, however, that the logic connections as shown may be changed to produce any of a combination of logic signals desired and which may be interpreted as the correct frequency. In the preferred embodiment and according to the principles of the invention, the frequency responsive amplitudes derived from a comparison of frequency responsive energy levels in the filters are again compared to produce logic signals which may go high or low depending upon the changes in the amplitudes produced by the incoming frequency and the relative amplitudes at the input to the comparators. Comparator 173, for example, produces a logic signal based upon the relative excursion of the two amplitudes of the first signal set signal 161b and second signal set signal 163a. It can be seen then as the input signal changes, the comparators 171, 173 and 175 will produce changing outputs responsively. For example, in the preferred embodiment as shown, comparator 171 has an inverting output which goes low at 1000 MHz and high at 1030 MHz. Comparator 173 has a noninverting input which goes high at 950 MHz and low at 990 MHz. It also has an inverting output which goes low at 950 MHz and high at 990 MHz opposite to the output of the noninverting output. Comparator 175 has a noninverting output which goes high at 980 MHz and low at 1020 MHz.

When, for example, the incoming signal is in the midfilter range of the center channel or from 985 MHz to 995 MHz, a pulse output will be produced at the noninverting output of comparator 173 and the inverting output of 173 and at the output of 175.

These signals at the output of comparators of 171, 173 and 175 may be further combined with the outputs of the first and second logic trees of FIG. 4 and FIG. 4a to provide pulses of greater frequency resolution. For example, the output of comparator 171 may be supplied to an AND gate 181 having as its second input the output 160a of the AND gate 160 of the crossover CCR gate of the second logic tree shown in FIG. 4a. The inverting and noninverting output of amplifier 173 may be provided to two separate AND gates (183, 185) which have as second enabling inputs, the output 133a of the midfilter CCR gate first logic tree shown in FIG. 4. The output of the comparator 175 may be supplied to an AND gate 187 which has a second input, the output (162a) of a crossover CCR gate first logic tree (not shown) producing an output when the incoming signal is at 975 to 985 MHz.

Similarly, to input 160a to AND gate 181 (from AND gate 160), the input signal 162a may be applied to AND gate 187 responsive to an input signal in the crossover range 975 to 985 MHz. As may be seen, the second logic tree of FIG. 4a would be duplicated for the crossover channels 970 and 990 MHz.

The first and second logic trees could be built for each of the N channels and to detect a signal located in a channel midfilter region or crossover regions between two channels. Accordingly, by duplicating the first logic tree of FIG. 4 and second logic tree of FIG. 4a for each center channel region, as for example 990 MHz in FIG. 4, or crossover region, as for example 995 to 1050 MHz in FIG. 4a, the logic trees then would provide first logic signals of the input frequency, whether in a midfilter or crossover region at the pulse steady state time. As shown in FIG. 5, the first logic signals could be combined with the second logic signals of the third logic tree to produce frequency indicative signals derived from the energy levels in the N filters during the time duration of the steady state input pulse when splatter is minimized and the energy differences in the separate N channels is maximized.

Additionally, common units may be combined to reduce the number of components as shown in FIG. 6, where the total number of channel is N. Accordingly, an intercept channelizer block diagram is shown in FIG. 6 wherein for each N channel, there are N+4 filters (two filters on either side of the center N channel) N+4 log amps (for the amplification of the energy levels within the channel filters), N+3 video difference amplifiers (required to amplify and detect the energy difference levels within each of the channel filters). Also, in parallel with the CCR comparator logic tree are two (N+3) discriminator comparators and four (N+3) discriminator gates comprising the discriminator third logic tree.

The meaning of FIG. 6 and its representation of the number of components required for each of the N channels is as follows. The diagrams of FIGS. 4, 4a and 5 show the logic trees for a center channel or center channels where logic trees as shown in FIGS. 4, 4a and 5 are duplicated for each of the N channels. As shown, FIG. 6 represents the first, second and third logic trees receiving information from the N channels and the associated guard channels. As would be known to those skilled in the art, it would not be necessary to build separate logic trees for each of the channels as the incoming signal frequency and energy levels would determine which logic trees would be used. In particular those logic trees connected to the center channel or crossover channels of the incoming signal and the adjacent guard channels would have sufficient energy to produce a frequency indicative logic signal. Therefore, the logic trees may be connected to receive the output of two or more of the N channels and the respective guard channels where signals in those channels would not present a conflict in the use of the associated logic trees.

Figure 2A:
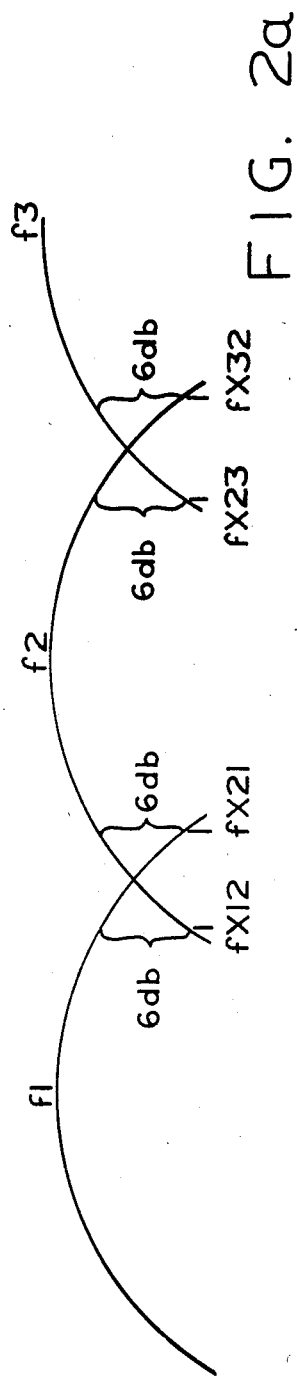
FIG. 2a shows the amplitude vs. frequency response of three filters arranged with a crossover region therebetween.

Referring now to FIG. 2a, it may be seen how for adjacent channels, the midchannel and cross channel regions may be established by using CCR's for the thresholds in the CCR gating networks of FIGS. 4 and 5. As shown, as the input frequency changes, the energy level within each of the channels will change and the amplitude of the channel log video output will change. The video difference amplifiers in the CCR gating network will then produce the difference between the channel log video outputs at any particular frequency. These outputs will be compared in the CCR comparators. By selecting an appropriate CCR threshold level in each comparator, the state of the comparator can be forced to change when the difference between the output of the energy levels in the adjacent channels and the corresponding difference output of the video difference amplifier falls above or below the threshold. In the example shown here, the threshold level is shown as 6b. A crossover region between the filter channel having center frequency $f_1$ and the filter channel having frequency $f_2$ is then shown in the frequency band between $fx_{12}$ and $fx_{21}$. At those levels, the difference between the response at the output of filter channel $f_1$ and the output of filter channel $f_1$ is less than 6 dB and does not increase to 6 dB until the incoming frequency is greater than $fx_{21}$. Similarly, the setting of the thresholds as shown also defines the midchannel region, for example, for the channel $f_2$ the midchannel region would be between $fx_{21}$ and $fx_{23}$. The crossover and midchannel regions can be varied in any predetermined fashion then by varying the threshold levels and thereby moving the midchannel and crossover region frequency ranges.

Then, as can be seen and according to the principles of the invention, the channelizer develops a signal indicative of the incoming signal frequency and related to a narrow band filter channel by processing the signal through the filter channel comprising that incoming frequency and by processing it through guard channels also comprising filters having defined narrow band widths. In the case of signals appearing within the midfilter range of a logic tree center filter channel, the outputs of that filter channel, and the two adjacent or guard channels on either side of that channel comprising the frequency are processed to produce logic signals responsive to the steady state portion of the pulse. In a similar manner, when an incoming signal is located in the crossover region between the center frequencies of two adjacent filters, the center channel filters, on either side of the crossover region are processed as well as that of the guard filters with respect to the center channels and on either side of the center channels. The outputs of the channels tuned to the signal and the guard channels adjacent and adjoining thereto are then processed as shown to produce logic signals during the steady state portion of the incoming pulse and during the splatter-free time when the amplitude difference representing the energy levels in the filters is efficiently different so that logic signals may be produced using appropriate threshold levels.

Further, according to the principles of the invention and as shown in FIG. 5, frequency discrimination logic signals are developed which may be combined with the CCR gating signals to produce a signal indicative of the incoming frequency normalized to the band width of the respective filters.

As the object is to define the incoming frequency in as narrow a band as possible, the application of the principles herein are desribed with regard to such a reasonable result. However, it should be understood that signals may be further combined to make the result less ambiguous or the frequency indication may be produced relative to a wider band of incoming signals or additional logic can be added and filter sensitivity can be increased to make the logic signal more selective and related to a narrower band of incoming frequencies.

Referring now to FIG. 6, the intercept channelizer block diagram is shown for the generalized case where the concept of establishing narrow band pass filter channels within a wideband pass input and identifying the correct incoming frequency by the energy distribution produced throughout a center channel matched to the incoming frequency on guard channels and comparing the energy levels in the center channel and the guard channels to determine the frequency of interest corresponding to the incoming signal during the steady state period of the incoming signal when it is most splatter-free is shown. As would be obvious to one skilled in the art, elements can be used in common by a center frequency and guard channel tree. However, the generalized case will be made with respect to a channelizing input having N channels.

Referring now to FIG. 2a, it may be seen how the midchannel and cross channel regions may be set by using the thresholds in the CCR gating networks in FIGS. 4, 4a and 5. As shown, as the input frequency changes, the energy level within each of the channels will change and the amplitude of a channel log video output will change. The video difference amplifiers on the CCR gating network will then take the difference between the channel log video outputs at any particular frequency. These outputs will be compared in the channel to channel ratio comparators. By selecting an appropriate threshold level in each comparator, the state of the comparator will change when the difference between the output of the energy levels in the adjacent channels and the corresponding difference output of the video difference amplifier falls below the threshold. In the example shown here, the threshold level is shown as 6b. A crossover region between the filter channel having central frequency $f_1$ and the filter channel having frequency $f_2$ is then shown with the frequency band between $fx_{12}$ and $fx_{21}$. At those levels, the difference between the response at the output of filter channel $f_1$ and the output of filter channel $f_2$ is less than 6 dB and does not increase to 6 dB until the frequency is greater than $fx_{21}$. Similarly, the setting of the thresholds also defines the midchannel region. For example, in the channel $f_2$ between $fx_{21}$ and $fx_{23}$. The crosschannel and midchannel regions can be varied in any predetermined fashion then by varying the thresholds.

Figure 3F:
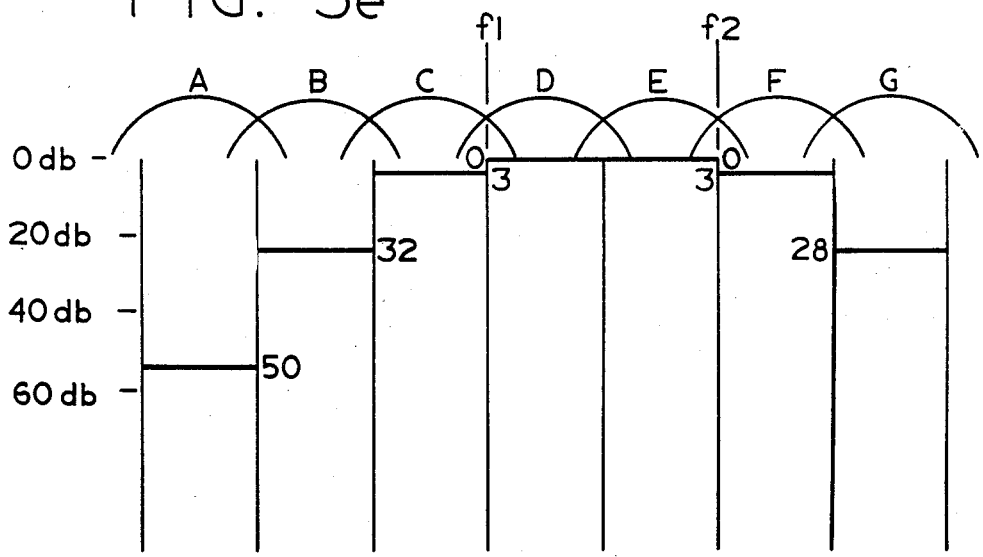

The principles of this invention may also be used to determine the frequencies of incoming signals simultaneously appearing in the wideband input and separated by one or more inactive channels. As shown in FIGS. 3d, 3e and 3f, simultaneous signals may appear centered in separate channels as shown in FIG. 3d or with one signal appearing centered in a channel and the other signal appearing in the crossover region as shown in FIG. 3e or with the two simultaneous signals appearing in the crossover regions of separate channels as shown in FIG. 3f. In the case of signals separated by one inactive channel, the distributions of energy levels in each channel can still be compared and measured according to the principles discussed so that the energy centroid may be located with respect to each incoming signal. However, splatter from either signal may extend over several channels and one signal splatter may momentarily blank the other. This phenomenon, however, as explained, will occur only during the rise and fall time of the adjacent signal. When simultaneous signals are separated by several channels, the strongest signal may suppress the weaker signal.

When simultaneous signals occur, the centroid location of the frequency for each incoming signal may be measured with the first, second or third logic trees as described above. The ability to detect the signals will vary with the frequency spacing between the simultaneous signals and the amplitude difference. As the amplitude difference increases, the ability to detect the frequency of two incoming simultaneously-appearing signals is made more difficult. However, as the frequency separation increases, the ability to detect the incoming frequency signals is made relatively easy as such that signals of greater amplitude separation may be detected at wide frequency separations as will be shown and described below.

Figure 7:
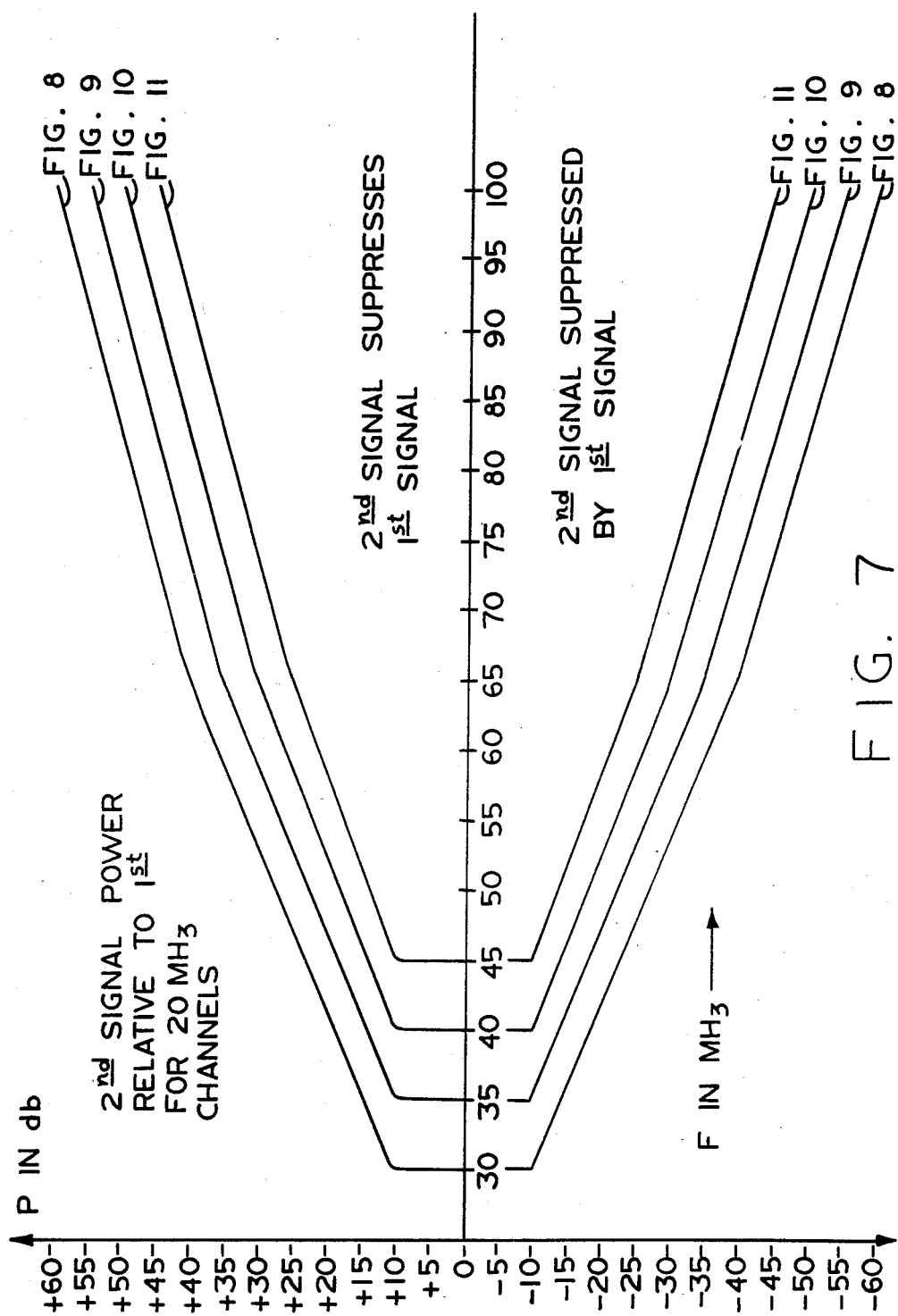
FIG. 7 shows by transfer characteristics, the ability of the invention to identify frequency when a plurality of signals, shown as examples, are separated by an inactive channel.

FIG. 7 is a plot of channelizer performance for two signals ($f_1$, $f_2$) anywhere within its signal separation frequency and amplitude characteristics.

The four cases shown in FIG. 7 are for respective examples of signal separation as represented in FIGS. 8, 9, 10 and 11. It should be understood, however, that the four cases as defined therein are shown for illustrative purposes, and the frequency spectrum for the incoming signals may be shown in other ways and specifically with other defined frequency locations for the signals of interest. However, these examples shown in FIGS. 8, 9, 10 and 11 and the characteristic for each of the four examples shown in FIG. 7, chosen to explain the inventive principle will illustrate the principle of the invention and its ability to identify frequency centroids for simultaneously-appearing signals separated by more than one inactive channel.

Figure 8:
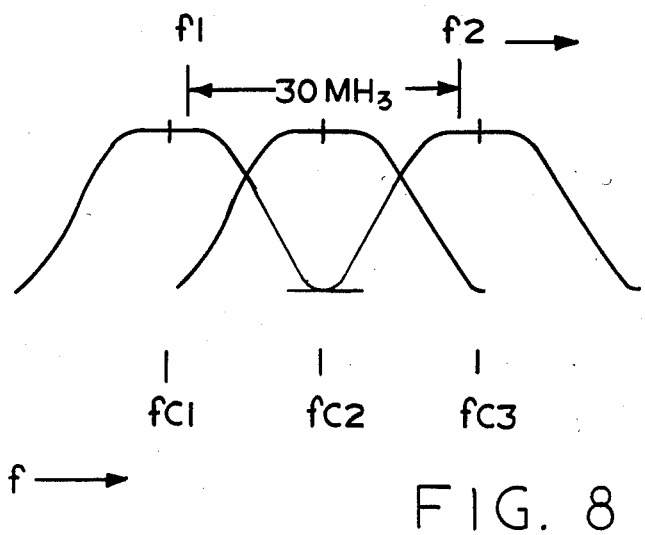
FIGS. 8-11 show the frequency locations of two simultaneously occurring incoming signals separated by an inactive channel and represented by the respective transfer characteristics of FIG. 7.
Figure 9:
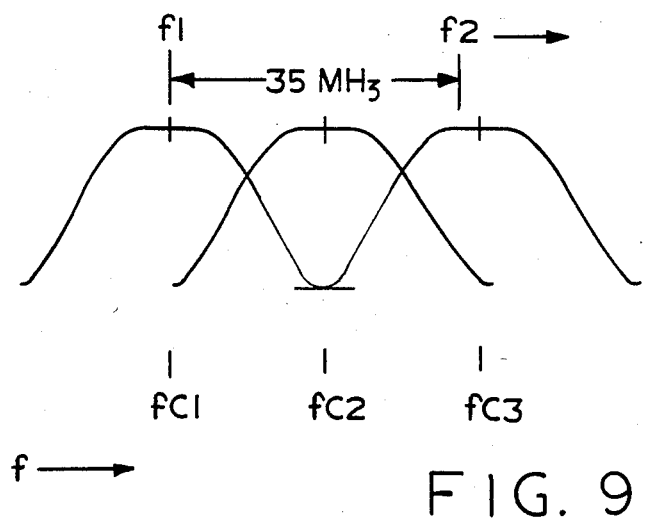
Figure 10:
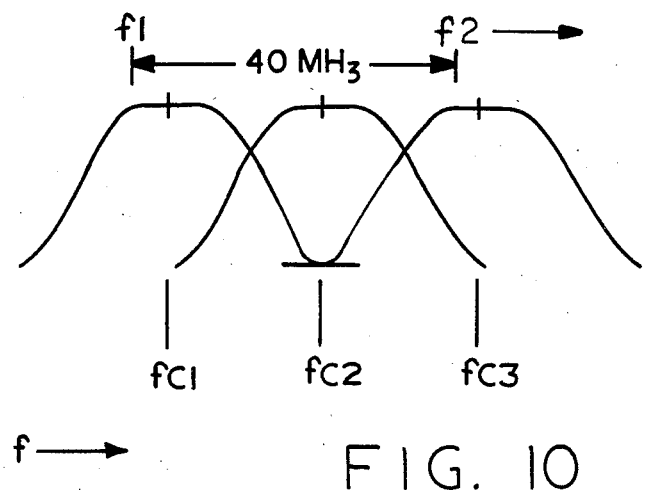

To assist in the explanation of this foregoing concept, reference is made to FIG. 2 wherein the bandpass for a filter is shown divided into quarters, with the crossover frequency points $fx_1$ and $fx_h$ being the extremes and with a lower half defined by the center frequency and the lower crossover point and an upper half defined by the center frequency and the upper crossover frequency $fx_h$. The quarter points are defined midway between the crossover points and the center frequency in each half, the lower and upper half respectively. In the example of the 20 MHz band pass filter of the preferred embodiment, the quarter points will occur 5 MHz from the crossover points and the center frequency points. For the purpose of explaining the manner in which the invention can identify simultaneously-appearing signals separated by an inactive channel, the chosen illustrations of FIGS. 8, 9, 10 and 11 show two signals $f_1$ and $f_2$. For the purpose of explanation, $f_2$ is always shown as the higher frequency signal and appearing in channel $fc_3$ at the $-\frac{1}{4}$ point (see FIG. 2) midway in the lower half of the frequency response of channel $fc_3$ and moves upward in frequency from that point. The lower frequency signal $f_1$ is shown at different locations within the lower frequency filter channel $fc_1$ and is at the upper quarter in FIG. 8, is at the midway point in FIG. 9, is at the lower quarter point in FIG. 10, and is at the lower crossover point at the lower frequency end of the lower half of channel $fc_1$. For purpose of explanation, it is assumed that the signal $f_1$ does not change in frequency and signal $f_2$ increases in frequency. FIG. 7 shows the range in which the preferred embodiment can distriminate between two simultaneous signals separated by an inactive channel using the 20 MHz filter channels and the 6 dB CCR's as described. However, it should be understood that the response shown in FIG. 7 is merely illustrative of the preferred embodiment and should not be thought as limiting the ability of the invention to identify simultaneous signals. As would be known to those skilled in the art, the ability to identify simultaneous signals can be increased or decreased depending upon the elements chosen and the selectivity and the response of those elements.

Referring now to FIG. 7, the ordinate shows the power of the second signal of frequency $f_2$ relative to the first signal of frequency $f_1$ for each of the incoming signals shown in FIGS. 8, 9, 10 and 11. For the preferred embodiment, and for the case shown in FIG. 8 where the lower signal $f_1$ is at the upper quarter point in channel $fc_1$ and the upper frequency signal $f_2$ is at the lower quarter point, then for 20 MHz bandpass channels, the signals would be separated by a minimum of 30 MHz. At 30 MHz, the preferred embodiment may detect the frequencies of the simultaneous-appearing signals when the second signal power relative to the first is less than ±8 dB. As shown, where the second signal power relative to the first is greater than ±8 dB or where the first signal power relative to the second is greater than ±8 dB, the second signal power suppresses the first signal or the second signal is suppressed by the first signal. For FIG. 8, as frequency increases from 30 MHz, the preferred embodiment is able to identify the frequency of the incoming signals where for any frequency separation between $f_2$ and $f_1$ as given by the abscissa, the ratio of $f_2$ signal power relative to that of $f_1$ is between the upper and lower curves denominated as FIG. 8. For example, where $f_2$ increases in frequency such as where the separation is 60 MHz, then where the second signal power relative to the first is within ±43 dB, the system can identify the frequencies f1 and $f_2$.

Whereas shown in FIG. 9, $f_2$ is at the $-\frac{1}{4}$ point in filter channel fc$_3$ and $f_1$ is at the midpoint of channel fc$_1$, the separation will be 35 MHz, for the 20 MHz channels. In that case, at 35 MHz the system will be able to identify the two frequencies when the second power relative to the first power is ±8 dB. As $f_2$ increases in where the relative power ratio is on or between the two curves shown as FIG. 9. Accordingly for FIG. 10, where $f_2$ is at the $-\frac{1}{4}$ point in channel fc$_3$ and $f_1$ is shown at the $-\frac{1}{4}$ point in channel fc$_1$ and separated by 40 MHz (where the channels are 20 MHz wide), then for a relative ratio of $f_2$ to $f_1$ of ±8 dB the preferred embodiment will be capable of identifying the second and first signal frequencies ($f_2$, $f_1$) at 40 MHz and, as $f_2$ increases, for all points along the curve shown as FIG. 10 and for points in between the curves shown as FIG. 10.

Figure 11:
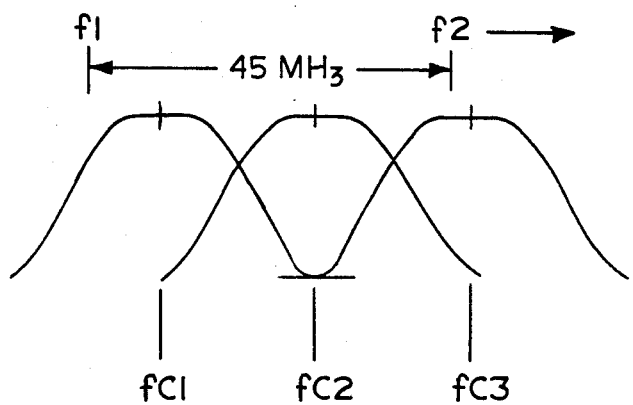

Similarly for FIG. 11, where $f_2$ is as shown, and $f_1$ is at the lower edge of the lower half of channel fc$_1$ and separated from $f_2$ by 45 MHz, (for the case of 20 MHz wide channels), then where the power ratio of $f_2$ to $f_1$ is ±8 dB, and at 45 MHz separation, the system will be able to identify the two signals and at all points along the curve and between the curves labeled FIG. 11.

It should be understood, however, that by making the components more selective, and by changing the resolution of the center channels, the system according to the principles of the invention may have a greater ability to identify incoming signal frequencies separated by an inactive channel, for smaller separations in frequency and for greater relative power ratios of second to first signal power.

I claim:

1. A method of determining the frequency of a narrow band signal received at the input of a wideband receiver comprising the steps of:
   (a) detecting the energy levels within the narrow band channels connected to receive said narrow band signals;
   (b) comparing the energy levels between said narrow band channels to produce a plurality of signals, each of said plurality of signals having a distinct amplitude verses frequency characteristic and being indicative of the energy difference between said channels at the received signal frequency;
   (c) comparing the amplitudes of said plurality of signals to produce second logic signals indicative of the said received signal frequency,
   (d) comparing the said energy levels in said narrow band channels with adjacent channels adjacent said respective ones of said narrow band channels and producing first input signals indicative of narrow band channel to respective adjacent channel energy differences,
   (e) establishing channel to channel logic ratios (CCR's) in a logic tree indicative of expected energy level differences between said narrow band channels and respective adjacent channels when said narrow band signal is in its steady state condition;
   (f) comparing said first input signals with said CCR's to produce logic signals identifying said first input signals which exceed said CRR's;
   (g) responsive to said logic signals producing a first logic signal indicative of the channel location and frequency of said received narrow band signal; and
   (h) combining said first logic signal with said second logic signal to produce a third logic signal indicative of the narrow band frequency location of the signal received at the input of the said wideband receiver when the narrow band received signal is at its steady state condition.

2. The method of claim 1, wherein
said step (b) of comparing includes the step (i) of producing distinct sets of signals indicative of the energy differences between said channels;
and said step (c) includes the step (j) of determining the higher and lower amplitudes of the signals of respective signal sets and, responsive to said determination producing said second logic signal.

3. The method of claim 2, wherein said step (i) includes the step (k) of:
producing a first set of signals comprising a signal representing the difference between a first of said narrow band channels and a respective adjacent channel having a higher frequency, and the inverse thereof,
producing a second set of signals comprising a signal representing the difference between said first of said narrow band channels and a respective adjacent channel having a lower frequency, and the inverse thereof;
said step (c) of comparing includes the steps of determining and identifying the higher and lower amplitudes of the said first signal set, relative to each other, or of the said second signal set, relative to each other, or of the higher and lower amplitudes of selected signals of said first signal set relative to selected signals of said second set; and responsive to said step of comparing the step of producing a logic signal indicative of the narrow band signal frequency.

4. The method of claim 1 wherein said CCR's are varied to vary the range of said narrow band channel.

5. The method of claim 4, wherein said step of varying the CCR's includes the step of establishing said CCR's at a predetermined amplitude level to define the mid-filter regions of said narrow band channels and the crossover region between said narrow band channels.

6. The method of claim 5, wherein said CCR's are increased in the first direction to narrow said midfilter regions.

7. The method of claim 6, wherein said CCR's are increased in a second direction to increase the range of said crossover region.

8. A system for determining the frequency of a narrow band signal received at the input of a wide band receiver comprising:
detecting means for detecting energy levels within narrow band filter channels connected to received said narrow band signal;
first comparing means for comparing the energy levels between said channels to produce a plurality of signals having distinct amplitude vs. frequency characteristics and being indicative of the energy difference between said channels at the received signal frequency;

second comparing means for comparing the amplitudes of said plurality of signals to produce second logic signals indicative of the said received signal frequency;

third comparing means for comparing the energy levels in said channels with adjacent channels adjacent said narrow band channels and producing first input signals indicative of channel to respective adjacent channel energy differences;

fourth comparing means establishing channel to channel ratios (CCR's) in a logic tree indicative of expected energy level differences between said narrow band channels and respective adjacent channels when said narrow band signal is in its steady state condition;

said fourth comparing means comparing said first input signals with said CCR's to produce first logic signals identifying said first input signals which exceed said CCR levels;

first logic means responsive to said first logic signals and producing a first logic signal indicative of the narrow band channel frequency of said received narrow band signal; and combining means, for combining said first logic signal with said second logic signal to produce a third logic signal indicative of the narrow band signal frequency of the narrow band signal received at the input of said wide band receiver when the narrow band received signal is in its steady state condition.

9. The system of claim 8, wherein said third comparing means includes means for producing a plurality of sets of signals indicative of the energy difference between said channels;

said second comparing means includes means for determining the higher and lower amplitudes of the said plurality of signals relative to each other; and said means for producing said second logic signal, produces said second logic signal responsive to said means for determining.

10. The system of claim 8, wherein said fourth comparing means includes identifying means for identifying those narrow band channels having an energy difference between it and said adjacent channels exceeding said CCR's.

11. The system of claim 10, wherein said fourth comparing means includes generating means responsive to said identifying means for producing said first logic signal.

12. The system of claim 11, wherein said fourth comparing means establishes said CCR's to be less than said energy level differences between a said narrow band channel and a respective adjacent channel which said narrow band signal is in the mid-filter range of said narrow band channel.

13. The system of claim 11, wherein said fourth comparing means establishes said CCR's to be greater than the energy level difference between a pair of adjacent narrow band channels and less than the energy level differences between said pair of narrow band channels and their respective adjacent channels when said narrow band signal is in the crossover region between said pair of adjacent narrow band channels.

* * * * *